(12) United States Patent
Liu et al.

(10) Patent No.: US 9,190,384 B2
(45) Date of Patent: Nov. 17, 2015

(54) PREFORM INCLUDING A GROOVE EXTENDING TO AN EDGE OF THE PREFORM

(71) Applicant: TriQuint Semiconductor, Inc., Hillsboro, OR (US)

(72) Inventors: Shixi Louis Liu, Milpitas, CA (US); Wenlong Ma, Fremont, CA (US); Frank Hin-Fai Chau, Fremont, CA (US); Barry Jia-Fu Lin, Cupertino, CA (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 31 days.

(21) Appl. No.: 14/221,182

(22) Filed: Mar. 20, 2014

(65) Prior Publication Data

US 2014/0206149 A1 Jul. 24, 2014

Related U.S. Application Data

(62) Division of application No. 12/847,477, filed on Jul. 30, 2010, now Pat. No. 8,718,720.

(51) Int. Cl.
*H01L 23/00* (2006.01)
*H01L 29/06* (2006.01)
(Continued)

(52) U.S. Cl.
CPC ............ *H01L 24/81* (2013.01); *B23K 35/0222* (2013.01); *H01L 21/76898* (2013.01); *H01L 24/29* (2013.01); *H01L 24/32* (2013.01); *H01L 24/83* (2013.01); *H01L 29/0657* (2013.01); *H01L 24/02* (2013.01); *H01L 24/05* (2013.01); *H01L 24/27* (2013.01); *H01L 2224/0239* (2013.01); *H01L 2224/02371* (2013.01); *H01L 2224/04026* (2013.01); *H01L 2224/05011* (2013.01); *H01L 2224/05548* (2013.01); *H01L 2224/05551* (2013.01); *H01L 2224/05569* (2013.01); *H01L 2224/05611* (2013.01); *H01L 2224/05644* (2013.01); *H01L 2224/05666* (2013.01); *H01L 2224/05684* (2013.01); *H01L 2224/2711* (2013.01); *H01L 2224/27334* (2013.01); *H01L 2224/27438* (2013.01); *H01L 2224/291* (2013.01); *H01L 2224/2912* (2013.01); *H01L 2224/29022* (2013.01); *H01L 2224/29023* (2013.01); *H01L 2224/29025* (2013.01); *H01L 2224/29109* (2013.01); *H01L 2224/29111* (2013.01); *H01L 2224/29144* (2013.01); *H01L 2224/32058* (2013.01);
(Continued)

(58) Field of Classification Search
None
See application file for complete search history.

(56) References Cited

U.S. PATENT DOCUMENTS 5,842,275 A * 12/1998 McMillan et al. ............... 29/840
6,362,435 B1 * 3/2002 Downey et al. ................ 174/260
(Continued)

OTHER PUBLICATIONS

Lee, Chin C. et al., "Advances in Bonding Technology for Electronic Packaging," Journal of Electronic Packaging, vol. 115/201; Jun. 1993.
(Continued)

*Primary Examiner* — Charles Garber
*Assistant Examiner* — Alia Sabur
(74) *Attorney, Agent, or Firm* — Withrow & Terranova, P.L.L.C.

(57) ABSTRACT

Embodiments include but are not limited to apparatuses and systems including a die or a preform including at least one groove configured to extend from at least one via of the die to an edge of the die. Other embodiments may be described and claimed.

12 Claims, 13 Drawing Sheets

(51) Int. Cl.
*B23K 35/02* (2006.01)
*H01L 21/768* (2006.01)

(52) U.S. Cl.
CPC ........... *H01L 2224/32059* (2013.01); *H01L 2224/32225* (2013.01); *H01L 2224/8309* (2013.01); *H01L 2224/83192* (2013.01); *H01L 2224/83193* (2013.01); *H01L 2224/83365* (2013.01); *H01L 2224/83815* (2013.01); *H01L 2924/00014* (2013.01); *H01L 2924/10155* (2013.01)

(56) References Cited

U.S. PATENT DOCUMENTS

| | | | |
|---|---|---|---|
| 6,380,060 B1* | 4/2002 | Zohni | 438/612 |
| 6,472,608 B2 | 10/2002 | Nakayama | |
| 6,670,222 B1 | 12/2003 | Brodsky | |
| 6,777,788 B1 | 8/2004 | Wan et al. | |
| 2004/0124543 A1* | 7/2004 | Condie et al. | 257/782 |
| 2006/0202351 A1 | 9/2006 | Lee et al. | |
| 2008/0224333 A1 | 9/2008 | Fukasawa | |
| 2009/0257208 A1 | 10/2009 | Filipovic et al. | |
| 2011/0266663 A1 | 11/2011 | Bauer et al. | |
| 2012/0009776 A1 | 1/2012 | Kirby et al. | |
| 2012/0168947 A1 | 7/2012 | Kim et al. | |

OTHER PUBLICATIONS

Lee, Chin C. et al., "Fundamentals of Fluxless Soldering Technology," Advanced Packaging Materials: International Symposium on Processes, Properties and Interfaces; IEEE, 2005.

Matijasevic, Goran et al., "Void-Free Au-Sn Eutectic Bonding of GaAs Dice and its Characterization Using Scanning Acoustic Microscopy," Dept. of Electrical Engineering, University of California, Journal of Electronic Materials, vol. 18, No. 2, Mar. 1989.

Nishiguchi, Masanori et al., "Highly Reliable Au-Sn Euctetic Bonding with Background GaAs LSI Chips," Electronic Manufacturing Technology Symposium, 1990 Proceedings, apos; Competitive Manufacturing for the Next Decade, apos; IEMT Symposium, Ninth IEEE/CHMT International, Volume, Issue, Oct. 1-3, 1990.

* cited by examiner

US 9,190,384 B2

PREFORM INCLUDING A GROOVE EXTENDING TO AN EDGE OF THE PREFORM

RELATED APPLICATIONS

This application is a divisional of U.S. Nonprovisional patent application Ser. No. 12/847,477 filed on Jul. 30, 2010, entitled "DIE INCLUDING A GROOVE EXTENDING FROM A VIA TO AN EDGE OF THE DIE," now U.S. Pat. No. 8,718,720, the disclosure of which is incorporated herein by reference.

TECHNICAL FIELD

Embodiments of the present invention relate generally to microelectronic devices and more particularly to semiconductor dies, and systems incorporating such dies.

BACKGROUND

Solder is commonly used for attaching dies to substrates. Bonding voids, however, are sometimes formed in the solder, due at least in part to the non-wettability of solder-to-die backside metal. The void problem may be particularly evident when a die has backside vias used for connecting one or more layers of the die to the backside metal layer, as the voids sometimes have a tendency to aggregate around the vias, due to air becoming trapped in the area around the vias. During solder reflow at elevated temperatures, the air around the vias expands, limiting the flow of solder to the area around the vias, resulting in voids. To avoid such voids, a scrubbing motion or vacuum solder reflow system may be used to help move the molten solder around to fill the voids created by the trapped air. Although void occurrence may be reduced by these methods, voids may still be present.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

For the purposes of the present disclosure, the phrase "A/B" means A or B. The phrase "A and/or B" means (A), (B), or (A and B). The phrase "at least one of A, B, and C" means (A), (B), (C), (A and B), (A and C), (B and C), or (A, B and C). The phrase "(A)B" means (B) or (A and B), that is, A is an optional element. In addition, although embodiments of the present disclosure may be shown and described as including a particular number of components or elements, embodiments are not limited to any particular number of components or elements.

Figure 1:
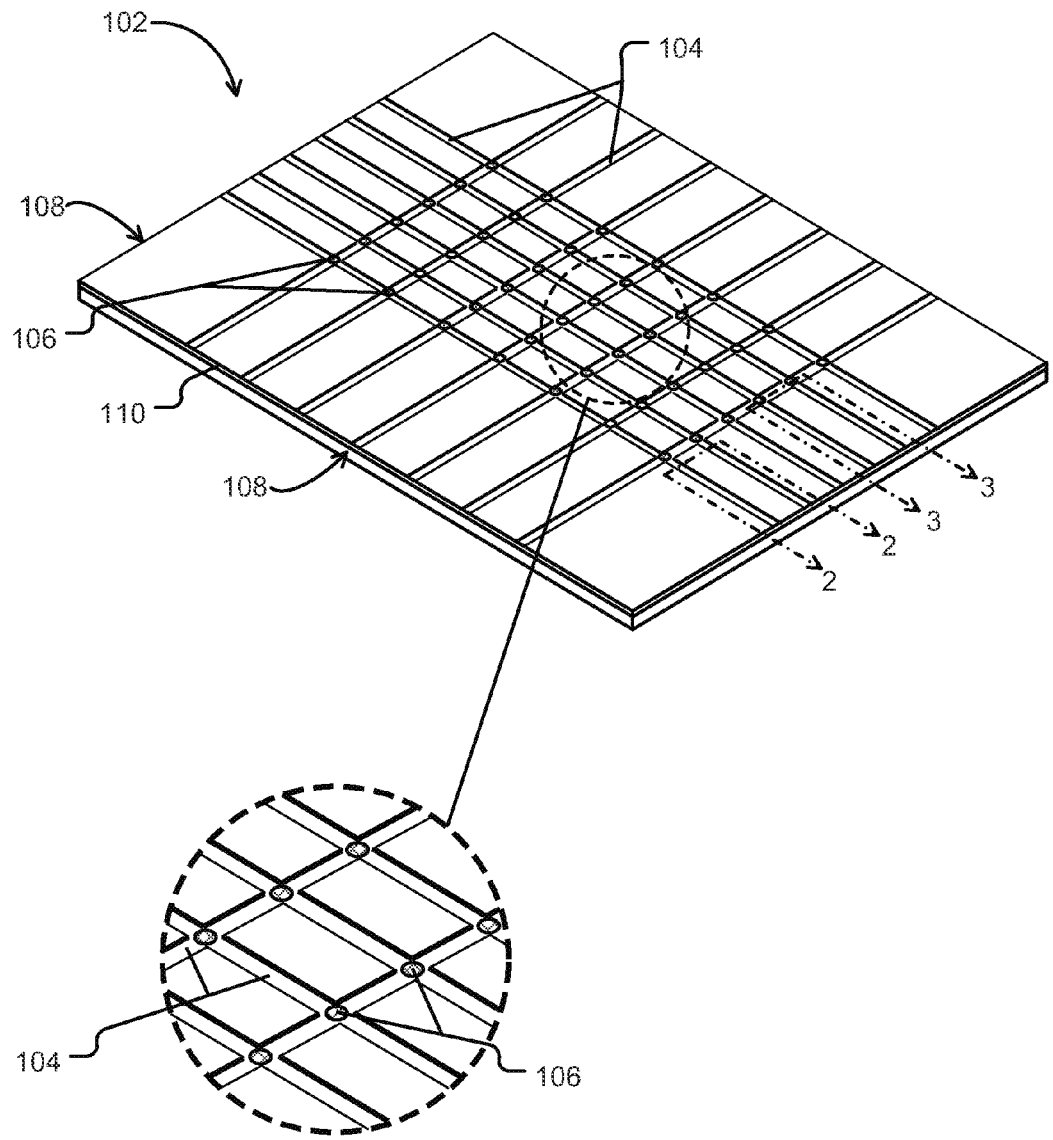
FIG. 1 is a perspective view of a die including grooves extending from vias to edges of the die in accordance with various embodiments.
Figure 2:
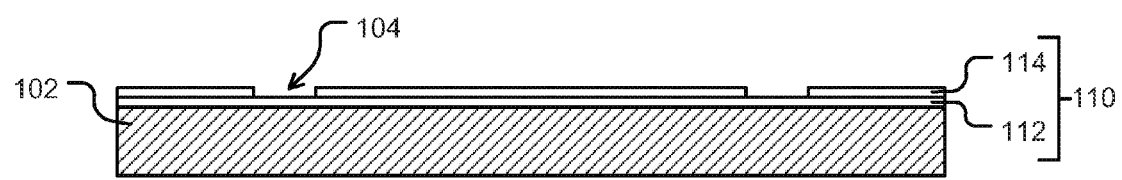
FIG. 2 is a sectional view of the die of FIG. 1, taken along line 2-2.
Figure 3:
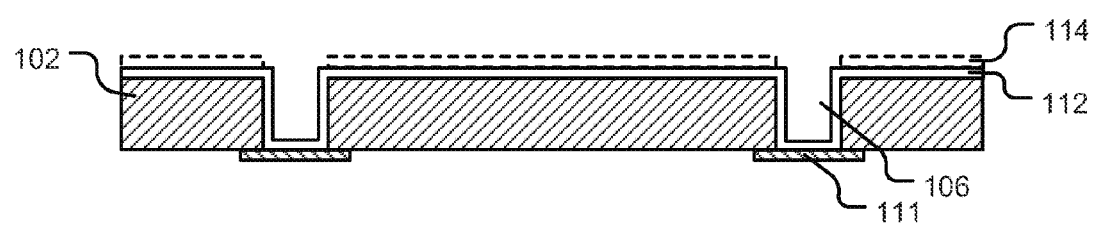
FIG. 3 is another sectional view of the die of FIG. 1, taken along line 3-3.

Turning now to FIG. 1, illustrated is a perspective view of a die 102 including grooves 104 extending from vias 106, to edges 108 of the die 102, in accordance with various embodiments. FIG. 2 illustrates a sectional view of the die 102 of FIG. 1, taken along line 2-2, and FIG. 3 illustrates a sectional view of the die 102 of FIG. 1, taken along line 3-3. The grooves 104 may allow for flow of air or other gas to the edges 108 of the die 102 during solder reflow, to reduce the possibility of solder voids (discussed more fully below).

As illustrated, the grooves 104 comprise a plurality of intersecting grooves, each groove extending from one edge 108 of the die 102 to the opposite edge 108, with a via 106 located at intersections of the grooves 104. The arrangement of the grooves 104, however, is not necessarily limited to the illustrated arrangement. For example, the grooves 104 may be u-shaped, zig-zagged, spiral-shaped, or some combination thereof, or some other arrangement. The grooves 104 may have a consistent width or may vary in width. For example, one or more of the grooves 104 may be tapered in width. In general, the grooves 104 may be arranged in any manner, so long as at least one groove 104 extends from at least one via 106 to at least one edge 108 of the die 102. For various embodiments, the arrangement may depend, at least in part, on the particular arrangement of the vias 106. If the vias 106 are arranged in a random manner, for example, the grooves 104 may also have a random arrangement.

The grooves 104 may have any depth suitable for providing flow of air or other gas to one or more of the edges 108 of the die 102. The die 102 may include a conductive layer 110 (e.g., a backside metal layer), and in those embodiments, the depth of the grooves 104 may depend, at least in part, on a thickness of the conductive layer 110. A suitable depth of the grooves 104 may be, for example, a few micrometers or more. In some embodiments, the depth of the grooves 104 may be approximately 5-10 micrometers.

As illustrated, the grooves 104 have a width such that the intersections of the grooves 104 have a size that is slightly larger than the diameter of the vias 106. In various embodiments, one or more of the grooves 104 may have a width that is larger than that illustrated (relative to the size of the vias 106), or the one or more grooves 104 may be smaller than the size of the vias 106, such that the width of the grooves 104 is smaller than a diameter of the vias 106. In any event, suitable movement of air/gas may be provided, so long as the grooves 104 and vias 106 have some overlap.

The conductive layer 110 may comprise any conductive material suitable for providing a conductive plane for the die 102. The conductive layer 110 may be a backside metal layer connected to one or more other layers of the die 102, and may be configured to serve as a ground plane. In various other embodiments, the die 102 may omit the conductive layer 110, in which case the grooves 104 may be formed on whatever material is disposed on the attachment surface of the die 102 (i.e., the surface of the die 102 to be attached to another surface—e.g., a substrate).

Because the grooves 104 are configured to allow for flow of air or other gas to the edges 108 of the die 102 to reduce the possibility of solder voids when the die 102 is attached to a substrate, the die 102 may generally comprise any type of die having exposed vias 106 on the attachment surface of the die 102. Dies for high power applications including, for example, power amplifiers, may find particular benefit in the use of grooves 104. High power dies generally require low thermal resistance, and voids in the solder layer attaching a die to a substrate may lead to increased thermal resistance and device failure. Larger dies may also benefit from the use of grooves 104, as any air or other gas trapped inside the vias 106 may have a longer distance to the edges 108 of the die 102, and thus, the air or other gas may have a greater probability of forming voids in the solder.

The conductive layer 110 may comprise one or more individual conductive layers. As illustrated in FIG. 2 and FIG. 3, for example, the conductive layer 110 may comprise a plurality of individual conductive layers 112, 114. For the illustrated embodiment, a first conductive layer 112 covers the surface of the die 102 and the sidewalls of the vias 106, and a second conductive layer 114 covers portions of the first conductive layer 112 to form the grooves 104. Layer 114 is illustrated in phantom in FIG. 3, as layer 114 is not present in the grooves 104 (in other words, the grooves 104 are essentially located where the layer 114 is shown in phantom in FIG. 3). Accordingly, the second conductive layer 114 may be formed with a thickness to form the grooves 104 with the desired thickness.

The individual layers 112, 114 of the conductive layer 110 may be formed of the same conductive material, or may instead be formed of layers of different conductive materials. For various embodiments, one or more of the individual conductive layers 112, 114 may comprise gold, tin, titanium, tungsten, or an alloy of one or more thereof.

A metal pattern 111 may be disposed on the surface of the die 102 opposite the surface having the grooves 104 for interconnecting various elements of the die 102 according to conventional practices. The portions of the conductive layer 110 (or the first conductive layer 112 if the conductive layer 110 comprises multiple layers) extending through the vias 106 may be configured to electrically connect the metal pattern 111 to the conductive layer 110 as illustrated.

The grooves 104 may be formed by an addition process or subtraction process. An addition process may comprise forming one or more first conductive layers 112 on the die 102, and then selectively forming one or more second conductive layers 114 on the first conductive layers 112 to form the grooves 104. A mask may be used to avoid forming the second conductive layer(s) 114 on those areas at which the grooves 104 are to be formed. For a subtraction process, one or more conductive layers 110 may be formed on the die 102, and then portions of the conductive layer(s) 110 may be etched to form the grooves 104. A mask may be used for limiting the etch to those area at which the grooves 104 are to be formed.

Figure 4:
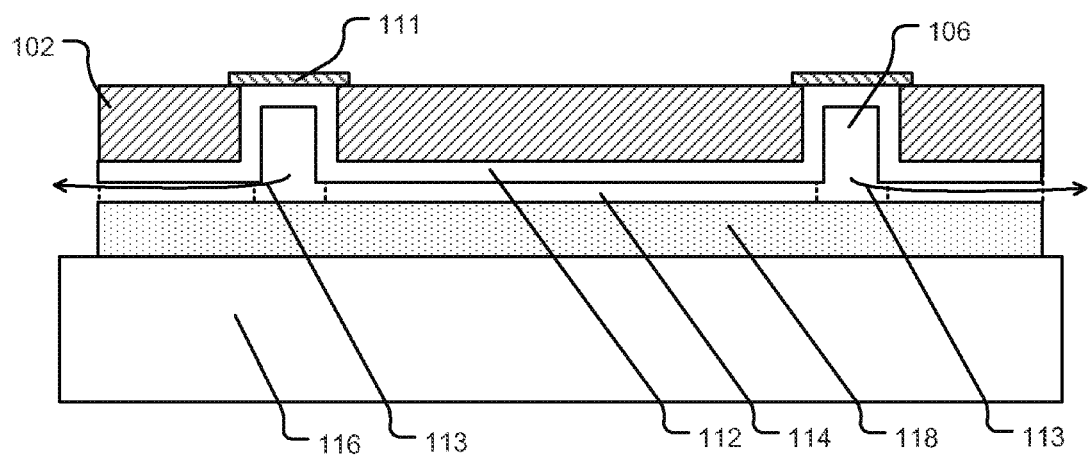
FIG. 4 is a sectional view of an apparatus including the die of FIG. 1, taken along line 3-3, prior to reflow.
Figure 5:
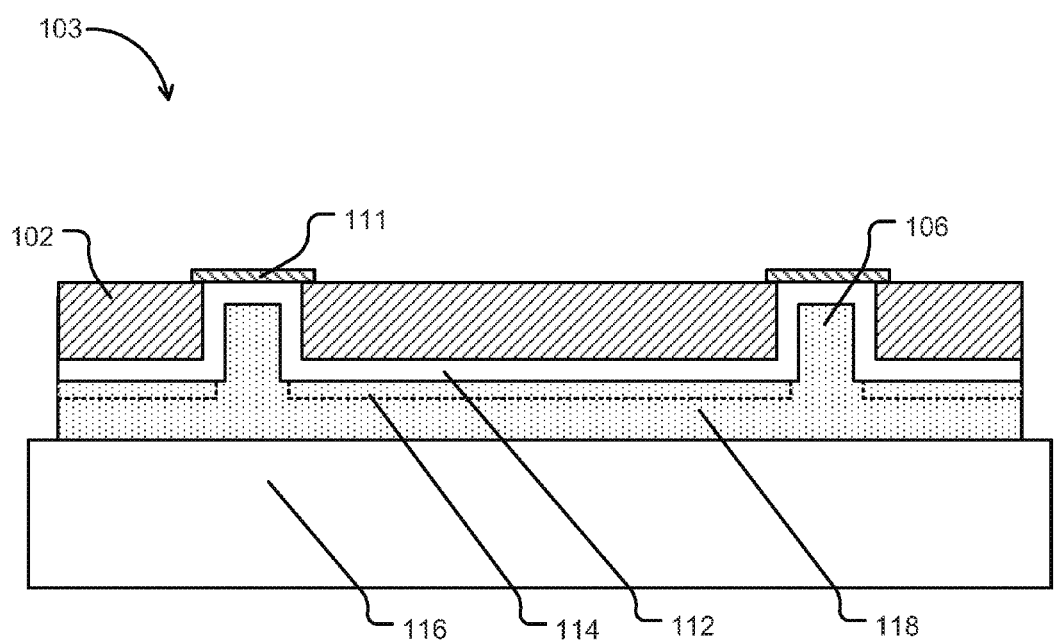
FIG. 5 is a sectional view of an apparatus including the die of FIG. 1, taken along line 3-3, after reflow.

Referring now to FIGS. 4 and 5, with continued reference to FIGS. 1-3, the die 102 may be coupled with a substrate 116 for forming a device package 103. FIGS. 4 and 5 show a sectional view of the die 102 of FIGS. 1 and 3, taken along line 3-3, wherein the grooves 104 are located where the second layer 114 is shown in phantom. The die 102 may be coupled with the substrate 116 using solder material 118 such as, for example, gold, tin, indium, antimony, or an alloy of one or more thereof. Other die attach material may be similarly suitable.

Before the solder material 118 is reflown, the raised portions (e.g., second conductive layer 114 of conductive layer 110 of the die 102) abut the solder material 118. As noted before, the grooves 104 are defined by the layer 114 and the layer 112, and in FIGS. 4 and 5, the grooves 104 are located where the layer 114 is shown in phantom. In other words, the grooves 104 form, in essence, channels (defined by the layer 114, layer 112, and the surface of the solder material 118) that extend to one or more of the edges 108 of the die 102. As the solder material 118 reflows along the grooves 104, air or other gas can freely escape via the grooves 104 via the pathways 113 formed by the grooves 104, without being trapped within the solder material 118 as voids. In various embodiments, a vacuum or low-pressure may further assist in removal of the air or other gas via the grooves 104.

As illustrated in FIG. 5, when the solder material 118 reflows, the solder material 118 flows into the grooves 104 and into the vias 106, at least partially filling the grooves 104 and the vias 106, resulting in a void-free, or substantially void-free, layer of solder material 118. In some embodiments, the vias 106 may be at least partially filled with a solder material 118 or other suitable interconnect material prior to solder reflow, or may instead be at least partially filled with the solder material 118 during the solder reflow as illustrated. If the vias 106 are not filled with the solder material 118 or other suitable interconnect material prior to solder reflow, some residual voids may be present in the vias 106.

Figure 6:
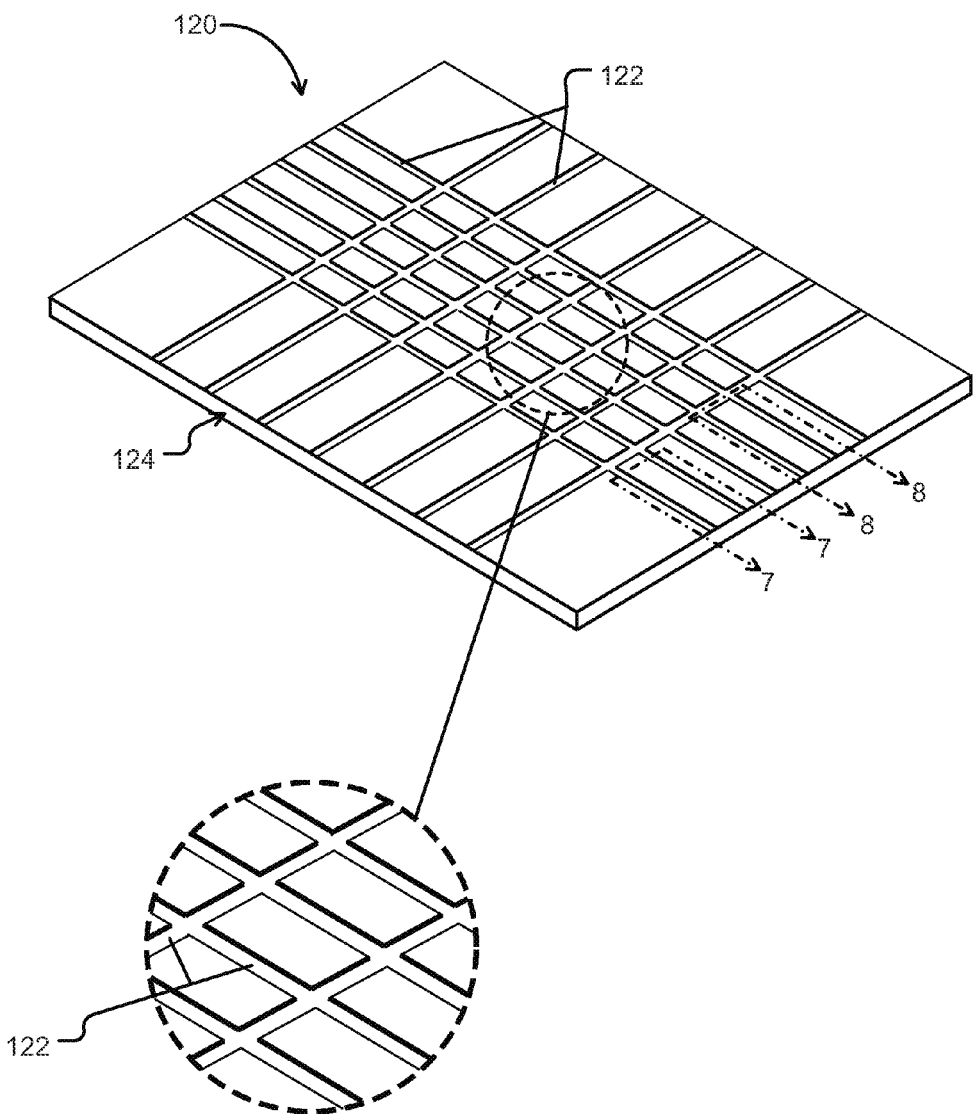
FIG. 6 is a perspective view of a solder preform comprising grooves configured to face a die and extend from at least one via of the die to an edge of the die in accordance with various embodiments.
Figure 7:
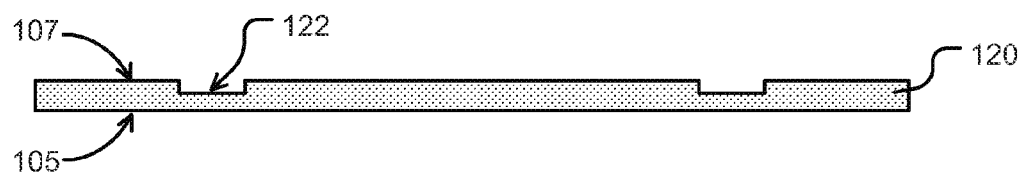
FIG. 7 is a sectional view of the solder preform of FIG. 6, taken along line 7-7.
Figure 8:
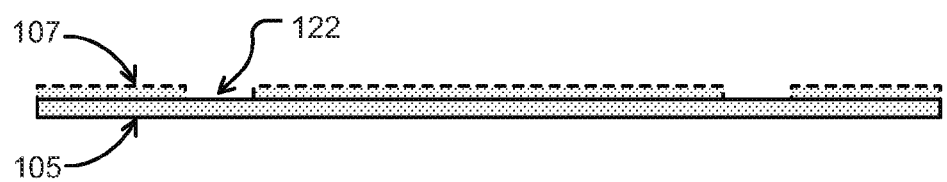
FIG. 8 is another sectional view of the solder preform of FIG. 6, taken along line 8-8.

In various embodiments, rather than, or in addition to, forming grooves 104 on the die 102, a die-attach preform comprising grooves may be used for reducing the incidence of voids. FIG. 6 illustrates an example of a preform 120 including grooves 122 extending to edges 124 of the preform 120, in accordance with various embodiments. FIG. 7 illustrates a sectional view of the preform 120 of FIG. 6, taken along line 7-7, and FIG. 8 illustrates a sectional view of the preform 120 of FIG. 6, taken along line 8-8. Layer 107 is illustrated in phantom in FIG. 8 as layer 107 may not be present in the grooves 122.

The preform 120 may comprise a first surface 105 and a second surface 107, opposite the first surface 105. The first surface 105 may be smooth or textured, and the second surface 107 may comprise grooves 122 configured to face a die, with or without similar grooves. The grooves 122 may extend to at least one edge 124 of the preform 120, and may be configured to extend from at least one via of the die to an edge of the die in embodiments in which the preform 120 and the die are similarly sized. Similar to the grooves 104 of the die 102 discussed above with reference to FIGS. 1-5, the grooves 122 of the preform 120 may comprise a plurality of intersecting grooves as illustrated, each groove extending from one edge 124 of the preform 120 to the opposite edge 124. The arrangement of the grooves 122 is not necessarily limited to the illustrated arrangement, and may depend on the particular arrangement of the vias of a die to which the preform is to be coupled.

The grooves 122 may have any depth suitable for providing the flow of air or other gas to one or more of the edges 124 of the preform 120. A suitable depth of the grooves 122 may be, for example, a few micrometers or more. In some embodiments, the depth of the grooves 122 may be approximately 5-10 micrometers.

The grooves 122 may have a width such that the intersections of the grooves 122 have a size that is slightly larger than the diameter of the vias of the die to which the preform 120 is to be coupled. In various embodiments, one or more of the grooves 122 may have a width that is larger than that illustrated (relative to the size of the vias of a die), or the one or more grooves 122 may be smaller than the size of the vias of the die such that the width of the grooves 122 is smaller than a diameter of the vias of the die. In any event, suitable movement of air/gas may be provided so long as the grooves 122 and vias of the die have some overlap.

The grooves 122 may be formed by any suitable method. For example, the grooves 122 may be formed by stamping during the preform manufacturing process. Other forming methods may be similarly suitable.

The preform 120 may be formed of solder material or another suitable die attach material. In various embodiments, the preform 120 may comprise any suitable solder material including, for example, gold, tin, indium, antimony, or an alloy of one or more thereof.

Figure 9:
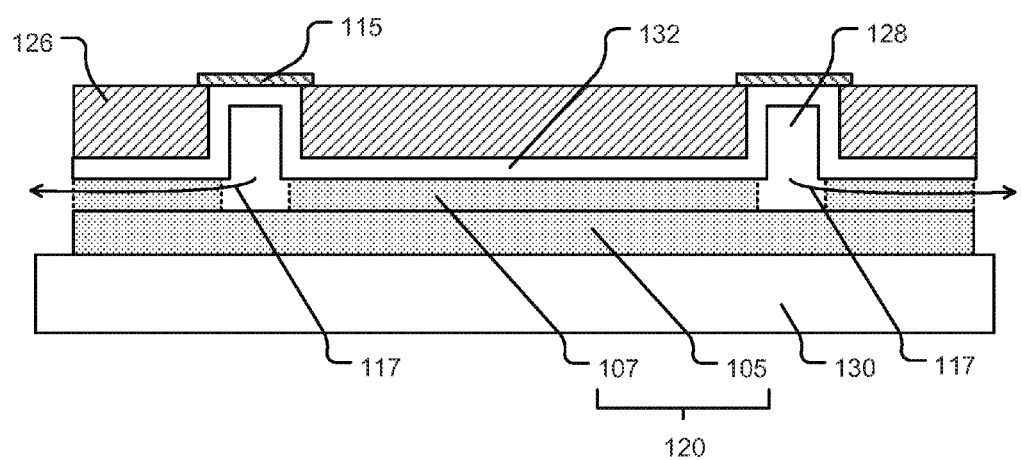
FIG. 9 is a sectional view of an apparatus including the solder preform of FIG. 6, taken along line 8-8, prior to reflow.
Figure 10:
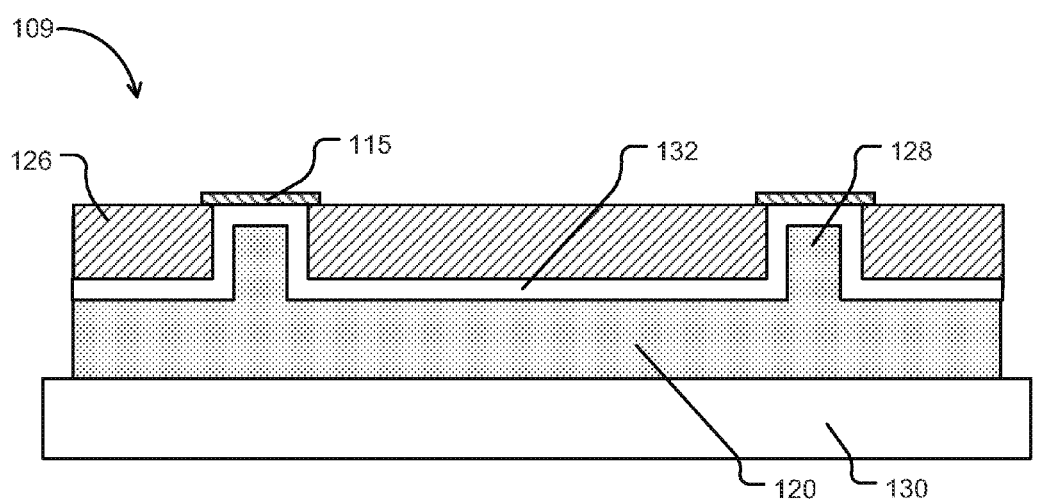
FIG. 10 is a sectional view of an apparatus including the solder preform of FIG. 6, taken along line 8-8, and a die coupled to a substrate after reflow.

Referring now to FIGS. 9 and 10, with continued reference to FIGS. 6-8, a die 126 including vias 128 may be coupled with a substrate 130 using the preform 120 for forming a device package 109. FIG. 9 shows a sectional view of the perform 120 of FIGS. 6 and 6, taken along line 8-8, wherein the grooves 122 are located where the raised portions 107 are shown in phantom. In this arrangement, the grooves 122 may allow for flow of air or other gas to the edges of the die 126 to reduce the possibility of solder voids in the reflown preform 120.

The die 126 may comprise any type of die having exposed vias 128 on the attachment surface of the die 126. Dies for high power applications including, for example, power amplifiers, may find particular benefit in the use of grooves 122. In various embodiments, the die 126 may include a conductive layer 132, which may be similar to the conductive layer 110 of the die 102 discussed earlier with reference to FIGS. 1-5. A metal pattern 115 may be disposed on the surface of the die 126 opposite the surface to be coupled with the substrate 130 for interconnecting various elements of the die 126 according to conventional practices. The conductive layer 132 on the sidewalls of the vias 128 and extending through the vias 128 may be configured to electrically connect the metal pattern 115 to the conductive layer 132 as illustrated.

As illustrated in FIG. 9, before the preform 120 is reflown, the conductive layer 132 of the die 126 abuts the raised portions 107 of the preform 120. As noted before, the grooves 122 are defined by the raised portions 107 and the first surface 105, and in FIG. 9, the grooves 122 are located where the raised portions 107 are shown in phantom. In other words, the grooves 122 form, in essence, channels (defined by the raised portions 107, the first surface 105, and the surface of the surface of the conductive layer 132) that extend to one or more of the edges of the die 126. As the preform 120 reflows, air or other gas can freely escape via the grooves 122 via the pathways 117 formed by the raised portions 107, without being trapped within the preform 120 as voids. In various embodiments, a vacuum or low-pressure may further assist in removal of the air or other gas via the grooves 122.

As illustrated in FIG. 10, after the preform 120 has reflown, the die attach material of the preform 120 replaces the grooves 122 (i.e., the die attach material flows into the grooves 122 during reflowing), at least partially filling the vias 128, and resulting in a void-free, or substantially void-free, layer of die attach material. Although the grooves 122 are essentially destroyed as a result of the reflowing, the groove structure may persist during the reflow operation itself for a time sufficient to allow at least some of the air/gas to escape. In some embodiments, the vias 128 may be at least partially filled with a solder material or other suitable interconnect material prior to solder reflow, or may instead be at least partially filled with the die attach material of the solder preform 120 during the solder reflow as illustrated. If the vias 128 are not filled with the solder material or other suitable interconnect material prior to solder reflow, some residual voids may be present in the vias 128.

Figure 11:
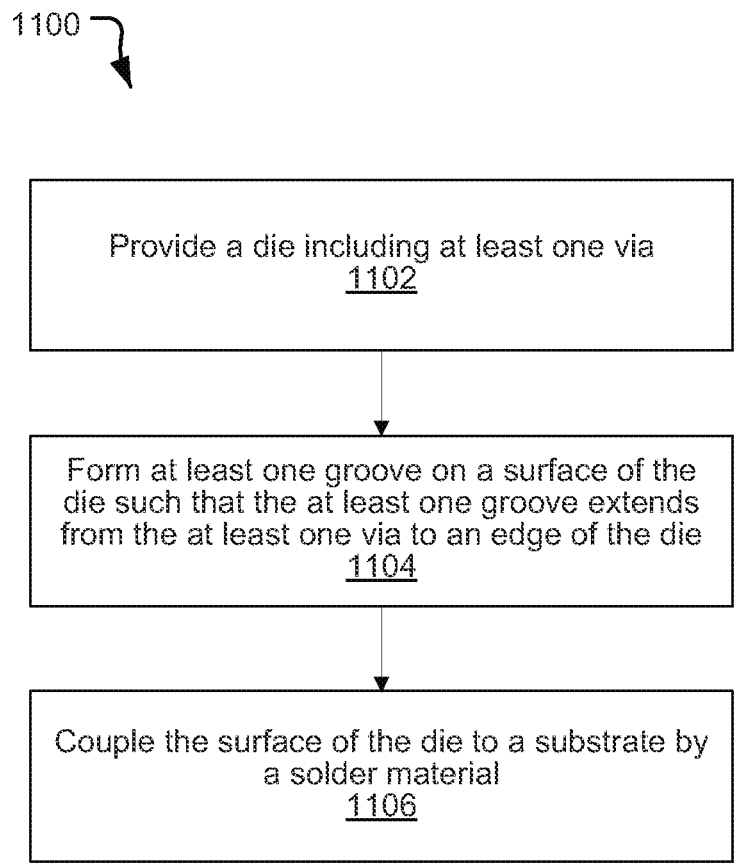
FIG. 11 is a flow diagram of some of the operations associated with making a die including grooves extending from vias to edges of the die in accordance with various embodiments.

Turning now to FIG. 11, illustrated is a flow diagram of some of the operations associated with an example method 1100 of making a die including grooves extending from vias to edges of the die in accordance with various embodiments described herein. It should be noted that although the method 1100 is illustrated as a series of sequential steps, the method 1100 is not necessarily order dependent. Moreover, methods within the scope of this disclosure may include more or fewer steps than that illustrated in FIG. 11.

According to various embodiments, a die including at least one via is provided at block 1102. The via may or may not be filled with a solder material or other suitable interconnect material at this point.

At block 1104, at least one groove may be formed on a surface of the die such that the at least one groove extends from the at least one via of the die to an edge of the die. The at least one groove may be formed by an addition process or a subtraction process, as described earlier.

At block 1106, the die having the at least one groove may be coupled with a substrate by a solder material for forming a device package. As described herein, the die may be abutted to the solder material prior to reflowing, and as the solder material reflows, the air or other gas can freely escape via the grooves without being trapped within the solder material as voids. In various embodiments, a vacuum or low-pressure may be used during at least part of the reflow process to further assist in removal of the air or other gas via the grooves. During reflow of the solder material, the solder material may flow into the grooves, filling the grooves and at least partially filling the voids, resulting in a void-free, or substantially void-free, layer of solder material coupling the die to the substrate.

Figure 12:
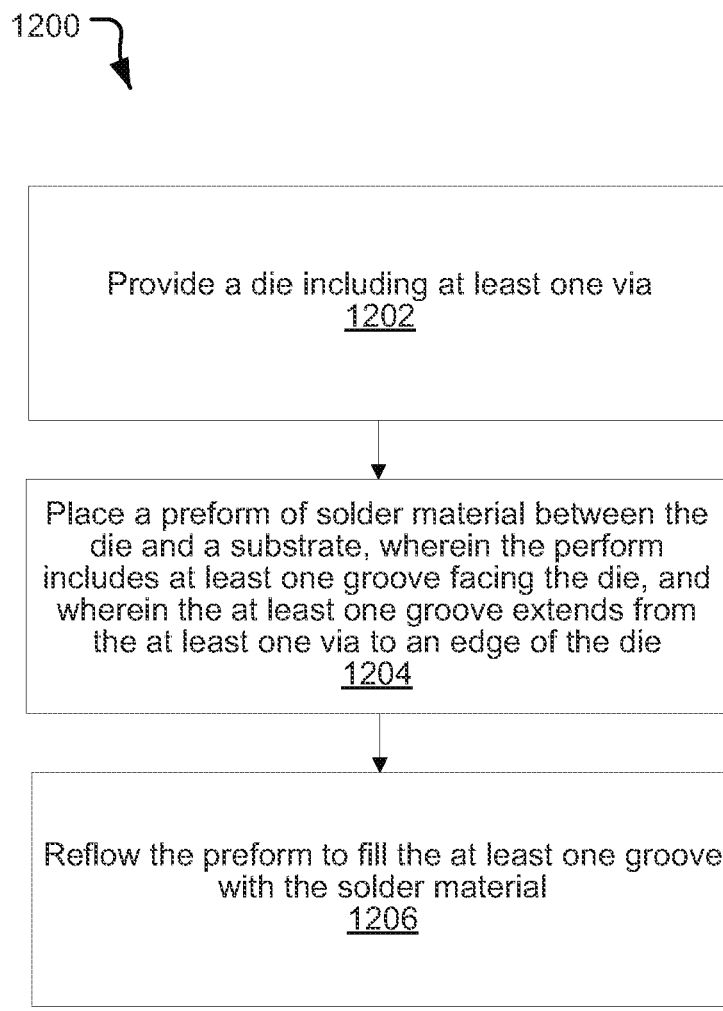
FIG. 12 is a flow diagram of some of the operations associated with making a solder preform comprising grooves configured to face a die and extend from at least one via of the die to an edge of the die in accordance with various embodiments.

FIG. 12 illustrates a flow diagram of some of the operations associated with an example method 1200 of making a solder preform comprising grooves configured to face a die and extend from at least one via of the die to an edge of the die, in accordance with various embodiments described herein. It should be noted that although the method 1200 is illustrated as a series of sequential steps, the method 1200 is not necessarily order dependent. Moreover, methods within the scope of this disclosure may include more or fewer steps than that illustrated in FIG. 12.

According to various embodiments, a die including at least one via is provided at block 1202. The at least one via may or may not be filled with a solder material or other suitable interconnect material. In various embodiments, the die may include at least one groove on a surface of the die and extending from the at least one via to an edge of the die.

At block 1204, a preform of solder material or other suitable die attach material may be placed between the die and a substrate, wherein the preform includes at least one groove facing the die, and wherein the at least one groove extends from the at least one via to an edge of the die. Placing the preform between the die and the substrate may include an alignment operation to substantially align the grooves, or intersection of grooves, to at least one of the vias of the die. In embodiments in which the die also includes at least one groove, the grooves of the preform and the grooves of the die may be substantially aligned when placing the preform between the die and a substrate.

At block 1206, the preform may be reflowed to fill the at least one groove with the solder material. Reflowing the preform may cause the preform to deform and re-shape into a die-attach layer without the at least one groove therein, such that the die-attach material covers the surface of the die, forming a void-free, or substantially void-free, layer of die-attach material coupling the die to the substrate.

Figure 13:
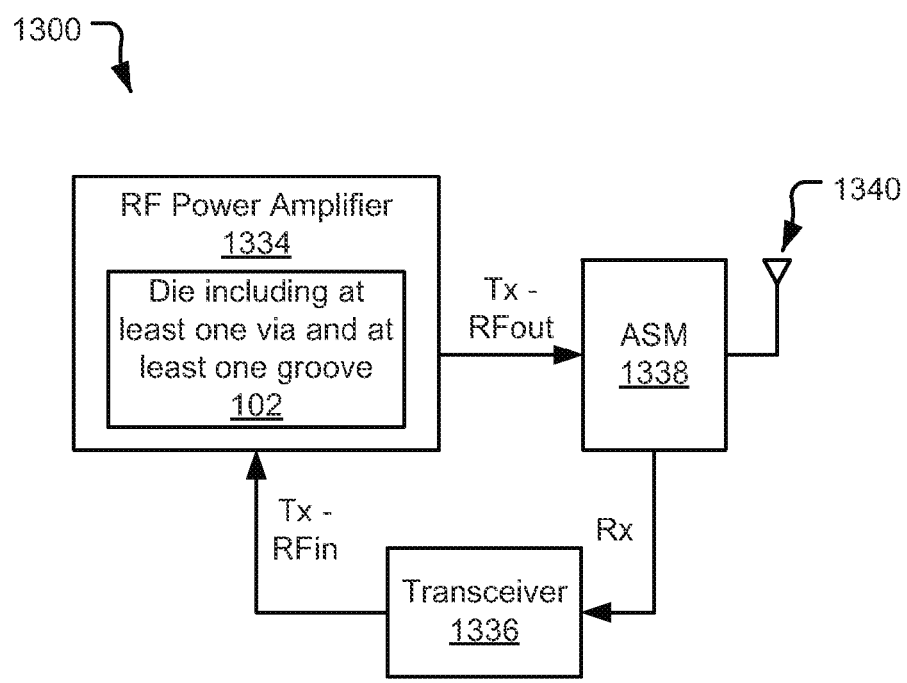
FIG. 13 is a block diagram of a system incorporating a die including grooves extending from vias to edges of the die in accordance with various embodiments.

Embodiments of dies including at least one groove described herein may be incorporated into various apparatuses and systems. A block diagram of an example system 1300 is illustrated in FIG. 13. As illustrated, the system 1300 includes an RF power amplifier 1334 having a die including at least one via, and at least one groove on a surface of the die and extending from the at least one via to an edge of the die. The system 1300 may include a transceiver 1336 coupled with the RF power amplifier 1334 as illustrated.

The RF power amplifier 1334 may receive an RF input signal, RFin, from the transceiver 1336. The RF power amplifier 1334 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 13.

The amplified RF output signal, RFout, may be provided to an antenna switch module (ASM) 1338, which effectuates an over-the-air (OTA) transmission of the RF output signal, RFout, via an antenna structure 1340. The ASM 1338 may also receive RF signals via the antenna structure 1340 and couple the received RF signals, Rx, to the transceiver 1336 along a receive chain.

In various embodiments, the antenna structure 1340 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 1300 may be any system including power amplification. In various embodiments, the system 1300 may be particularly useful for power amplification at high radio frequency power and frequency. For example, the system 1300 may be suitable for any one or more of terrestrial and satellite communications, radar systems, and possibly in various industrial and medical applications. More specifically, in various embodiments, the system 1300 may be a selected one of a radar device, a satellite communication device, a mobile handset, a cellular telephone base station, a broadcast radio, or a television amplifier system.

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Those with skill in the art will readily appreciate that embodiments in accordance with the present disclosure may be implemented in a very wide variety of embodiments. This description is intended to be regarded as illustrative instead of restrictive.

The invention claimed is:

1. A preform comprising:
a first surface; and
a second surface, opposite the first surface, and including a groove to face a semiconductor die and extend from at least one via of the semiconductor die to an edge of the semiconductor die, wherein the perform is comprised of a solder material.

2. The preform of claim 1, wherein the groove extends to an edge of the preform.

3. The preform of claim 1, wherein the preform comprises a plurality of intersecting grooves including the groove.

4. The preform of claim 3, wherein a first set of the plurality of grooves extends from a first edge of the preform to a second edge of the preform that is opposite the first edge and a second set of the plurality of intersecting grooves extends from a third edge of the preform to a fourth edge of the preform that is opposite the third edge.

5. The preform of claim 1, wherein the groove is approximate 5-10 microns deep.

6. A method comprising:
providing a semiconductor die including at least one via;
placing a preform of solder material between the die and a substrate, wherein the preform includes a groove facing the semiconductor die, and wherein the groove extends from the at least one via to an edge of the semiconductor die; and
reflowing the preform to fill the groove with the solder material.

7. The method of claim 6, wherein the reflowing couples the semiconductor die with the substrate.

8. The method of claim 6, wherein the groove is a first groove and the preform further comprises a second groove that intersects the first groove,
   wherein the placing comprises aligning the intersection of the first groove and the second groove with a first via of the at least one via.

9. The method of claim 6, wherein the groove extends to an edge of the preform.

10. The method of claim 6, wherein the preform comprises a plurality of intersecting grooves including the groove.

11. The method of claim 10, wherein a first set of the plurality of grooves extends from a first edge of the preform to a second edge of the preform that is opposite the first edge and a second set of the plurality of intersecting grooves extends from a third edge of the preform to a fourth edge of the preform that is opposite the third edge.

12. The method of claim 6, wherein the groove is approximately 5-10 micrometers deep.

* * * * *